United States Patent
Mihara et al.

(10) Patent No.: US 8,507,309 B2
(45) Date of Patent: Aug. 13, 2013

(54) IMAGING APPARATUS HAVING A PHOTOSENSOR PROVIDED ON A LOWER SURFACE OF A SEMICONDUCTOR SUBSTRATE AND A LENS UNIT PROVIDED ON AN UPPER SURFACE OF THE SEMICONDUCTOR SUBSTRATE, AND MANUFACTURING METHOD OF THE SAME

(75) Inventors: Ichiro Mihara, Tachikawa (JP); Takeshi Wakabayashi, Sayama (JP)

(73) Assignee: Teramikros, Inc., Tokyo (JP)

( * ) Notice: Subject to any disclaimer, the term of this patent is extended or adjusted under 35 U.S.C. 154(b) by 0 days.

(21) Appl. No.: 13/115,348

(22) Filed: May 25, 2011

(65) Prior Publication Data
US 2011/0291212 A1    Dec. 1, 2011

(30) Foreign Application Priority Data

May 28, 2010    (JP) ................... 2010-123117

(51) Int. Cl.
*H01L 21/00*    (2006.01)
*H01L 31/0203*    (2006.01)

(52) U.S. Cl.
USPC    438/70; 438/65; 257/E33.056; 257/E33.058; 257/434

(58) Field of Classification Search
USPC ............. 438/65, 70; 257/E33.056, E33.058, 257/434
See application file for complete search history.

(56) References Cited

U.S. PATENT DOCUMENTS

| | | | |
|---|---|---|---|
| 4,689,652 A | 8/1987 | Shimada et al. | |
| 6,605,828 B1 | 8/2003 | Schwarzrock et al. | |
| 7,390,688 B2 * | 6/2008 | Wakabayashi et al. | 438/68 |
| 7,417,330 B2 * | 8/2008 | Wakabayashi et al. | 257/790 |
| 7,663,096 B2 * | 2/2010 | Farnworth et al. | 250/239 |
| 7,759,751 B2 * | 7/2010 | Ono | 257/432 |
| 7,939,361 B2 * | 5/2011 | Honda | 438/64 |
| 2004/0251509 A1 * | 12/2004 | Choi | 257/432 |
| 2005/0073017 A1 | 4/2005 | Kim | |
| 2005/0140021 A1 * | 6/2005 | Wakisaka et al. | 257/777 |
| 2006/0060984 A1 * | 3/2006 | Wakabayashi et al. | 257/780 |

(Continued)

FOREIGN PATENT DOCUMENTS

| | | |
|---|---|---|
| JP | 2007-312270 A | 11/2007 |
| JP | 2010-56292 A | 3/2010 |
| WO | WO 2007/002832 A1 | 1/2007 |

OTHER PUBLICATIONS

Singaporean Office Action dated Jan. 13, 2012 (in English) in counterpart Singapore Application No. 201103842-9.

(Continued)

*Primary Examiner* — Kimberly Rizkallah
*Assistant Examiner* — Alexander Belousov
(74) *Attorney, Agent, or Firm* — Holtz, Holtz, Goodman & Chick, P.C.

(57) ABSTRACT

A photosensor comprises a photoelectric conversion device region and a connection pad on the lower surface of a semiconductor substrate, and also comprises a wiring line connected to the connection pad via insulating film under the semiconductor substrate, and a columnar electrode as an external connection electrode connected to the wiring line. As a result, as compared with the case where the photoelectric conversion device region and the connection pad connected to the photoelectric conversion device region are formed on the upper surface of the semiconductor substrate, a piercing electrode for connecting the connection pad and the wiring line does not have to be formed in the semiconductor substrate. Thus, the number of steps can be smaller, and a fabrication process can be less restricted.

9 Claims, 12 Drawing Sheets

(56) References Cited

U.S. PATENT DOCUMENTS

| | | |
|---|---|---|
| 2006/0186542 A1* | 8/2006 | Wakabayashi et al. ....... 257/737 |
| 2007/0001094 A1 | 1/2007 | Rhodes |
| 2007/0007556 A1* | 1/2007 | Shibayama .................... 257/228 |
| 2008/0185603 A1* | 8/2008 | Itoi et al. ......................... 257/98 |
| 2008/0211045 A1* | 9/2008 | Ono .............................. 257/432 |
| 2009/0079073 A1* | 3/2009 | Mizusawa et al. ............. 257/738 |
| 2009/0243097 A1* | 10/2009 | Koroku et al. ................. 257/737 |
| 2010/0053318 A1* | 3/2010 | Sasaki ........................... 348/125 |

OTHER PUBLICATIONS

Chinese Office Action dated Apr. 2, 2013 issued in counterpart Chinese Application No. 201110138732.3.

* cited by examiner

IMAGING APPARATUS HAVING A PHOTOSENSOR PROVIDED ON A LOWER SURFACE OF A SEMICONDUCTOR SUBSTRATE AND A LENS UNIT PROVIDED ON AN UPPER SURFACE OF THE SEMICONDUCTOR SUBSTRATE, AND MANUFACTURING METHOD OF THE SAME

CROSS-REFERENCE TO RELATED APPLICATIONS

This application is based upon and claims the benefit of priority from prior Japanese Patent Application No. 2010-123117, filed May 28, 2010, the entire contents of which are incorporated herein by reference.

BACKGROUND OF THE INVENTION

1. Field of the Invention

The present invention relates to an imaging apparatus having a photosensor and a manufacturing method of the same.

2. Description of the Related Art

According to Jpn. Pat. Appln. KOKAI Publication No. 2010-56292, a glass plate having a lens is mounted on the lower surface of a photosensor via a frame-shaped spacer. In this case, the photosensor comprises a semiconductor substrate. A light receiving portion is provided in the center of the upper surface of the semiconductor substrate. A connection pad is provided in the peripheral part of the upper surface of the semiconductor substrate to be connected to the light receiving portion.

A wiring line is provided on the lower surface of the semiconductor substrate. For, for example, a CMOS, the wiring line is essential to extract a signal as a voltage. One end of the wiring line is connected to the connection pad via a piercing electrode provided within a through-hole which is provided in the peripheral part of the semiconductor substrate. An insulating film is provided on the lower surface of the semiconductor substrate except for a land of the wiring line. The land of the wiring line is exposed through an opening provided in the insulating film. A solder ball is provided on the lower surface of the land of the wiring line exposed through the opening provided in the insulating film.

According to Jpn. Pat. Appln. KOKAI Publication No. 2010-56292, a semiconductor wafer greater in thickness than a semiconductor substrate of an imaging apparatus as a finished product is first prepared. In this case, a light receiving portion is provided in the center of the upper surface of an imaging apparatus formation region of the semiconductor substrate, around which a connection pad is provided to be connected to the light receiving portion.

Furthermore, a glass plate having the same size as the semiconductor wafer and having lenses provided on its lower surface is mounted on the semiconductor wafer via a lattice-shaped spacer. The lower side of the semiconductor wafer is then ground to reduce the thickness of the semiconductor wafer. A through-hole is then formed in the peripheral part within the imaging apparatus formation region of the semiconductor wafer. A wiring line and a piercing electrode are then formed on the lower surface of the semiconductor wafer including the inside of the through-hole by electrolytic plating.

An insulating film having an opening is then formed on the lower side of the semiconductor wafer. A solder ball is then formed on the lower surface of a land of the wiring line exposed through the opening of the insulating film. The semiconductor wafer, the lattice-shaped spacer, and a glass plate having the same size as the semiconductor wafer are then cut to obtain imaging apparatuses.

In the meantime, the problem of the above-mentioned conventional method of manufacturing the imaging apparatus is that the number of steps in the process of forming the through-hole in the peripheral part within the imaging apparatus formation region of the semiconductor wafer is relatively great. For example, the process includes the formation of a resist film on the lower surface of the semiconductor wafer, the formation of an opening in the resist film, the formation of the through-hole in the semiconductor wafer by etching that uses the resist film as a mask, and the detaching of the resist film. Moreover, before the step of grinding the lower side of the semiconductor wafer to reduce the thickness of the semiconductor wafer, the glass plate having the same size as the semiconductor wafer has to be disposed on the semiconductor wafer for reinforcement. This disadvantageously restricts a fabrication process.

It is therefore an object of the present invention to provide an imaging apparatus and a manufacturing method of the same that enable a reduction in the number of steps and also enables a fabrication process to be less restricted.

BRIEF SUMMARY OF THE INVENTION

According to one aspect of the present invention, there is provided an imaging apparatus comprising a lens unit which light enters from one surface thereof, and a photosensor provided on the other surface of the lens unit, the photosensor comprising a semiconductor substrate which the light exiting from the lens unit enters from one surface thereof, and a photoelectric conversion device and a connection pad which are provided on the other surface of the semiconductor substrate.

According to another aspect of the present invention, there is provided an imaging apparatus manufacturing method according to the invention comprising disposing a lens unit on the other surface of a semiconductor wafer of a photosensor, a photoelectric conversion device region and a connection pad being provided on one surface of the semiconductor wafer.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

Figure 1:
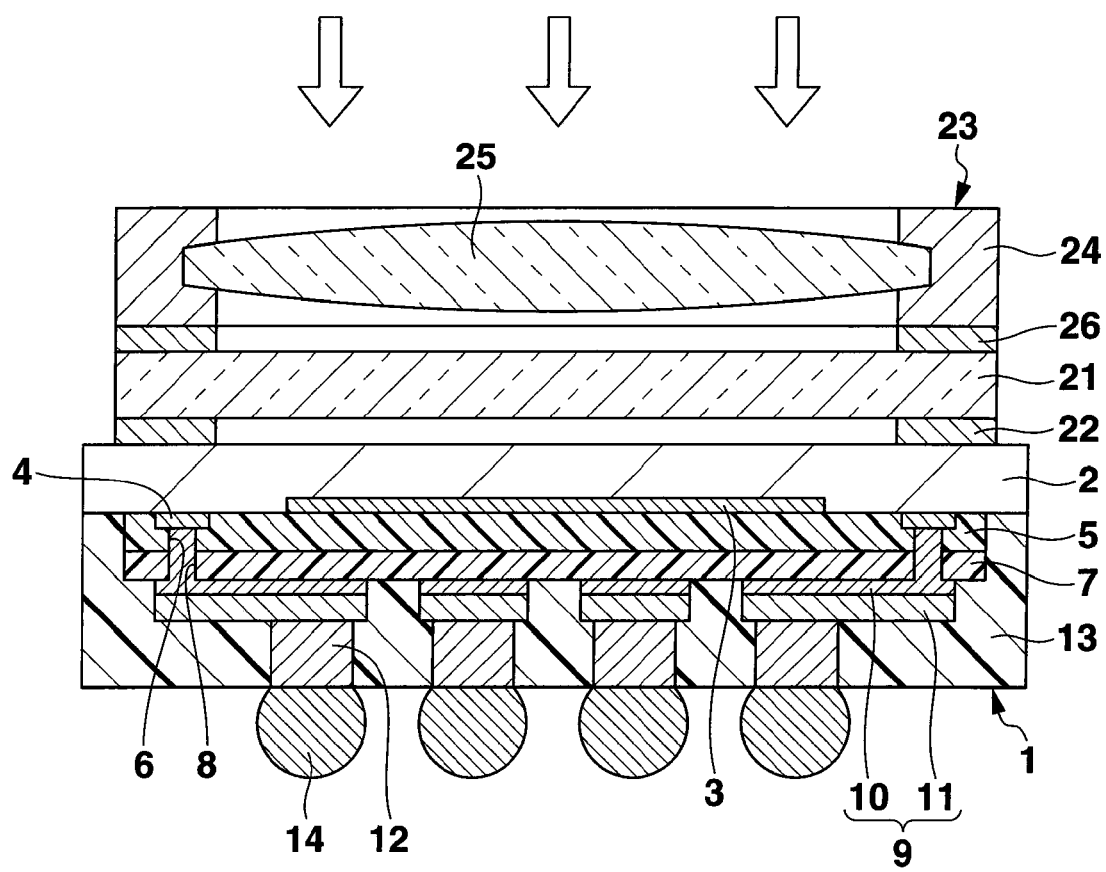
FIG. 1 is a sectional view of an imaging apparatus according to a first embodiment of the present invention.

FIG. 1 shows a sectional view of an imaging apparatus according to a first embodiment of this invention. This imaging apparatus comprises a photosensor 1. The photosensor 1 comprises a semiconductor substrate 2 having a square planar shape. The semiconductor substrate 2 is made of, for example, silicon, or gallium arsenide which is a compound semiconductor including gallium (Ga) and arsenic (As). A photoelectric conversion device region 3 including elements such as a charge coupled device (CCD), a photodiode, and a phototransistor is provided in the center of the lower surface of the semiconductor substrate 2. Connection pads 4 made of, for example, an aluminum-based metal are provided in the peripheral part of the lower surface of the semiconductor substrate 2 so that the connection pads 4 are connected to the photoelectric conversion device region 3.

A passivation film (insulating film) 5 made of, for example, silicon oxide or silicon nitride is provided on the lower surface of the semiconductor substrate 2 except for the peripheral part of the semiconductor substrate 2 and the centers of the connection pads 2. The center of the connection pad 4 is exposed through an opening 6 provided in the passivation film 5. A protective film (insulating film) 7 made of, for example, a polyimide resin is provided on the lower surface of the passivation film 5. An opening 8 is provided in a part of the protective film 7 that corresponds to the opening 6 of the passivation film 5.

Wiring lines 9 are provided on the lower surface of the protective film 7. Each of the wiring lines 9 has a two-layer structure including a foundation metal layer 10 which is made of, for example, copper and which is provided on the lower surface of the protective film 7, and an upper metal layer 11 which is made of copper and which is provided on the lower surface of the foundation metal layer 10. One end of the wiring line 9 is connected to the connection pad 4 via the openings 6 and 8 in the passivation film 5 and the protective film 7.

A columnar electrode (external connection electrode) 12 made of copper is provided on the lower surface of a land of the wiring line 9. A sealing film 13 made of an epoxy resin containing a silica filler is provided around the columnar electrode 12 on the lower surface of the peripheral part of the semiconductor substrate 2 and on the lower surface of the protective film 7 including the wiring line 9. Here, the columnar electrode 12 is provided so that the lower surface thereof is flush with or is 1 to 2 μm depressed from the lower surface of the sealing film 13.

As described above, the photosensor 1 comprises the semiconductor substrate 2, the photoelectric conversion device region 3, the connection pad 4, the passivation film 5, the protective film 7, the wiring line 9 having the two-layer structure including the foundation metal layer 10 and the upper metal layer 11, the columnar electrode 12, and the sealing film 13. A solder ball 14 is provided on the lower surface of the columnar electrode 12 of the photosensor 1.

A visible light transmitting plate (visible light transmitting material) 21 having a square planar shape is affixed to the upper surface of the semiconductor substrate 2 of the photosensor 1 via a square frame-shaped adhesive layer 22. The visible light transmitting plate 21 functions as an infrared out filter, and is an infrared reflecting type or an infrared absorbing type. The planar size of the visible light transmitting plate 21 is slightly smaller the planar size of the semiconductor substrate 2 of the photosensor 1.

For the visible light transmitting plate 21, any material that transmits visible light can be used, such as glass, a methacrylic resin, a fluorene resin, a cycloolefin polymer, an epoxy resin, polyethylene, polystyrene, an AS resin, polyethylene terephthalate, a vinylidene chloride resin, polycarbonate, or a light-blocking ceramic.

A lens unit 23 is provided on the upper surface of the visible light transmitting plate 21. The lens unit 23 is provided with a lens 25 which is disposed within a frame-shaped lens holder 24 above the photoelectric conversion device region 3 of the photosensor 1. The lower surface of the lens holder 24 of the lens unit 23 is affixed to the peripheral part of the upper surface of the visible light transmitting plate 21 via a frame-shaped adhesive layer 26. As indicated by arrows in FIG. 1, light enters from the side of the lens unit 23 provided on the other surface of the semiconductor substrate 2. The light which has passed through the lens 25 is collected in the photoelectric conversion device region 3, and transmitted to the wiring line 9.

Here, the lens 25 well transmits infrared rays, and the photoelectric conversion device region 3 has a high infrared sensitivity. Therefore, the sensitivity of the photosensor 1 is mainly dependent on the visible light transmitting plate 21 which cuts infrared rays and which is located before the photoelectric conversion device region 3. Both the infrared reflectance factor and the infrared absorption factor of the visible light transmitting plate 21 are 90% or more. Thus, the infrared transmission factor of the visible light transmitting plate 21 is 10% or less. The visible light transmitting plate 21 also functions to protect the photoelectric conversion device region 3. The wavelength of infrared rays cut by reflection or absorption corresponds to electromagnetic waves having a frequency of about 0.7 μm to 1000 μm. The wavelength of visible light transmitted by the visible light transmitting plate 21 corresponds to electromagnetic waves having a frequency of about 380 to 780 nm.

Figure 2:
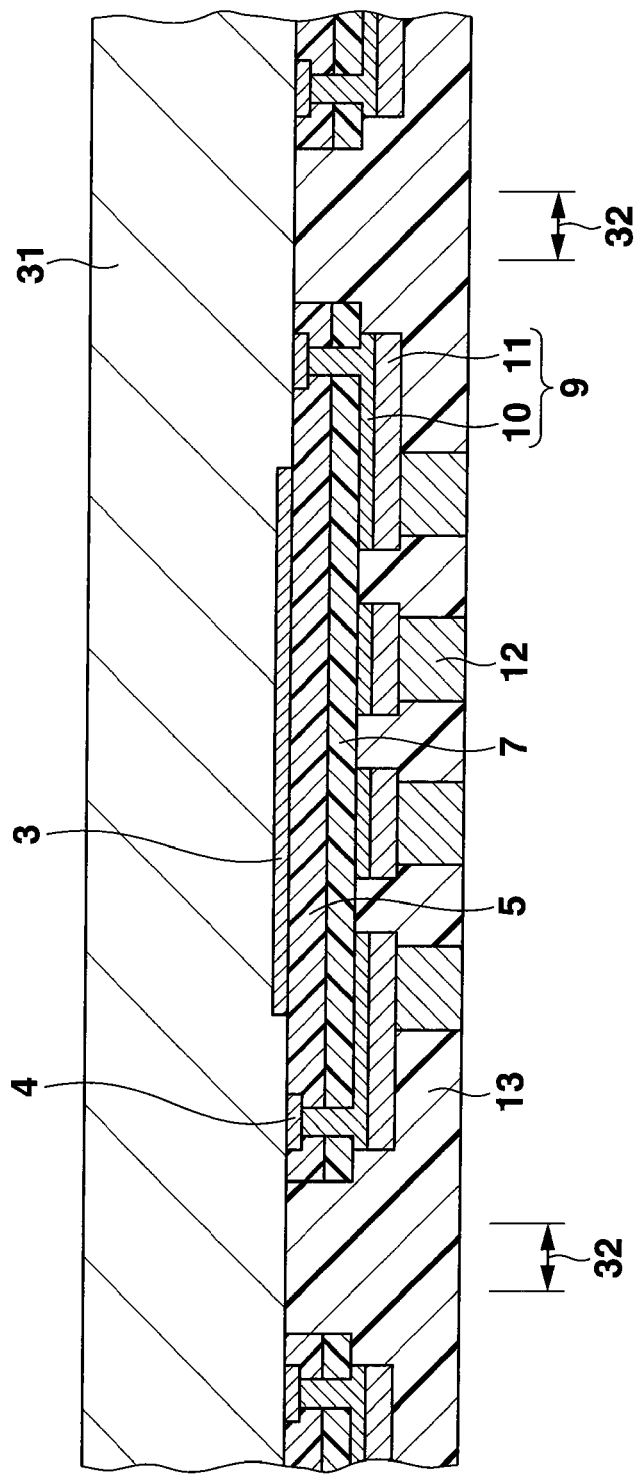
FIG. 2 is a sectional view of a part of an initially prepared assembly in one example of a method of manufacturing the imaging apparatus shown in FIG. 1.

Now, one example of a method of manufacturing this imaging apparatus is described. First, as shown in FIG. 2, an assembly is prepared. In this assembly, a photoelectric conversion device region 3, a connection pad 4, a passivation film 5, a protective film 7, a wiring line 9 having a two-layer structure including a foundation metal layer 10 and an upper metal layer 11, a columnar electrode 12, and a sealing film 13 are formed on the lower surface of a semiconductor substrate in a wafer state (hereinafter referred to as a semiconductor wafer 31).

One example of a method of manufacturing this prepared assembly is briefly described. First, the photoelectric conversion device region 3, the connection pad 4, the passivation film 5, and the protective film 7 are formed under the semiconductor wafer 31. A foundation metal layer (10) is then formed on the entire lower surface by electroless plating. The upper metal layer 11 and the columnar electrode 12 are then formed by electrolytic plating using the foundation metal layer (10) as a plating current path. The foundation metal layer (10) in a region other than the upper metal layer 11 is then removed by etching that uses the upper metal layer 11 as a mask, thereby forming the wiring line 9 having the two-layer structure including the foundation metal layer 10 and the upper metal layer 11. A sealing film 13 is then formed, around the columnar electrode 12, on the lower surface of the semiconductor wafer 31 around the protective film 7 and on the lower surface of the protective film 7 including the wiring line 9. Thus, the prepared assembly shown in FIG. 2 is obtained.

In this case, no piercing electrode has to be formed in the semiconductor wafer 31. Therefore, the number of steps can be smaller than when the piercing electrode is formed in the semiconductor wafer 31. Here, the thickness of the semiconductor wafer 31 shown in FIG. 2 is greater than the thickness of the semiconductor substrate 2 shown in FIG. 1. In FIG. 2, zones indicated by the sign 32 are dicing streets.

Figure 3:
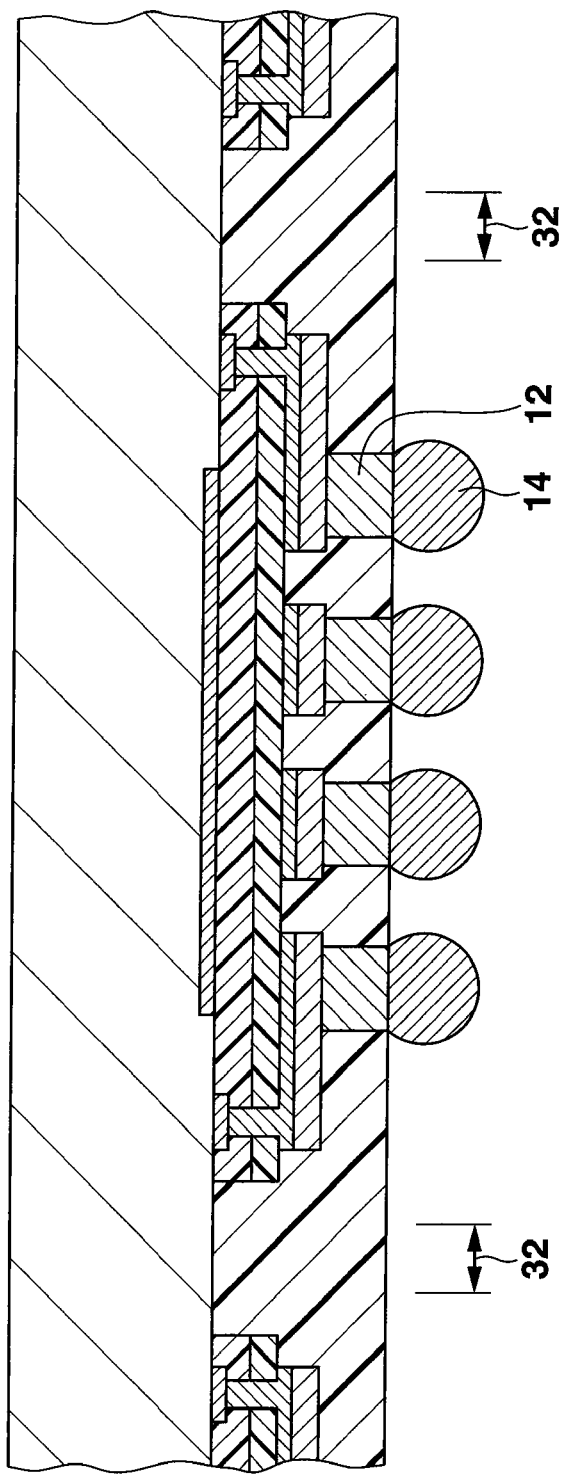
FIG. 3 is a sectional view of a step following FIG. 2.

As shown in FIG. 3, a solder ball 14 is then formed on the lower surface of the columnar electrode 12. In order to form the solder ball 14, first, a solder paste is applied to or a solder ball is mounted on the lower surface of the columnar electrode 12. Further, reflow is carried out to form the solder ball 14 on the lower surface of the columnar electrode 12.

Figure 4:
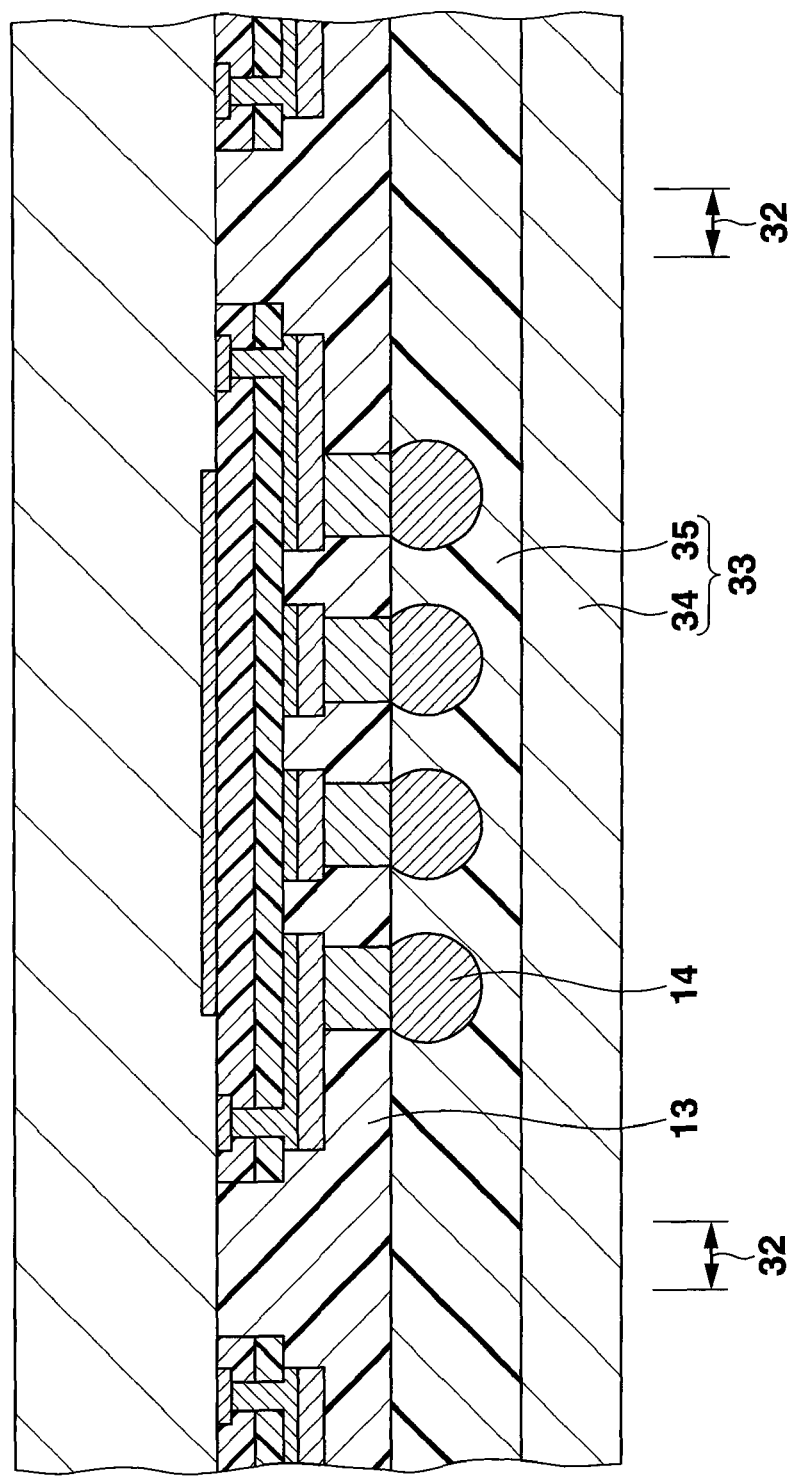
FIG. 4 is a sectional view of a step following FIG. 3.

As shown in FIG. 4, a protective tape 33 is then prepared. This protective tape 33 includes an ultraviolet-curing uncured sticking agent layer 35 provided on the upper surface of a base material film 34. The uncured sticking agent layer 35 of the protective tape 33 is affixed to the lower surface of the sealing film 13 including the solder ball 14. In this case, the thickness of the sticking agent layer 35 is greater than the height of the solder ball 14. Therefore, in this condition, the solder ball 14 is completely covered with the sticking agent layer 35.

Figure 5:
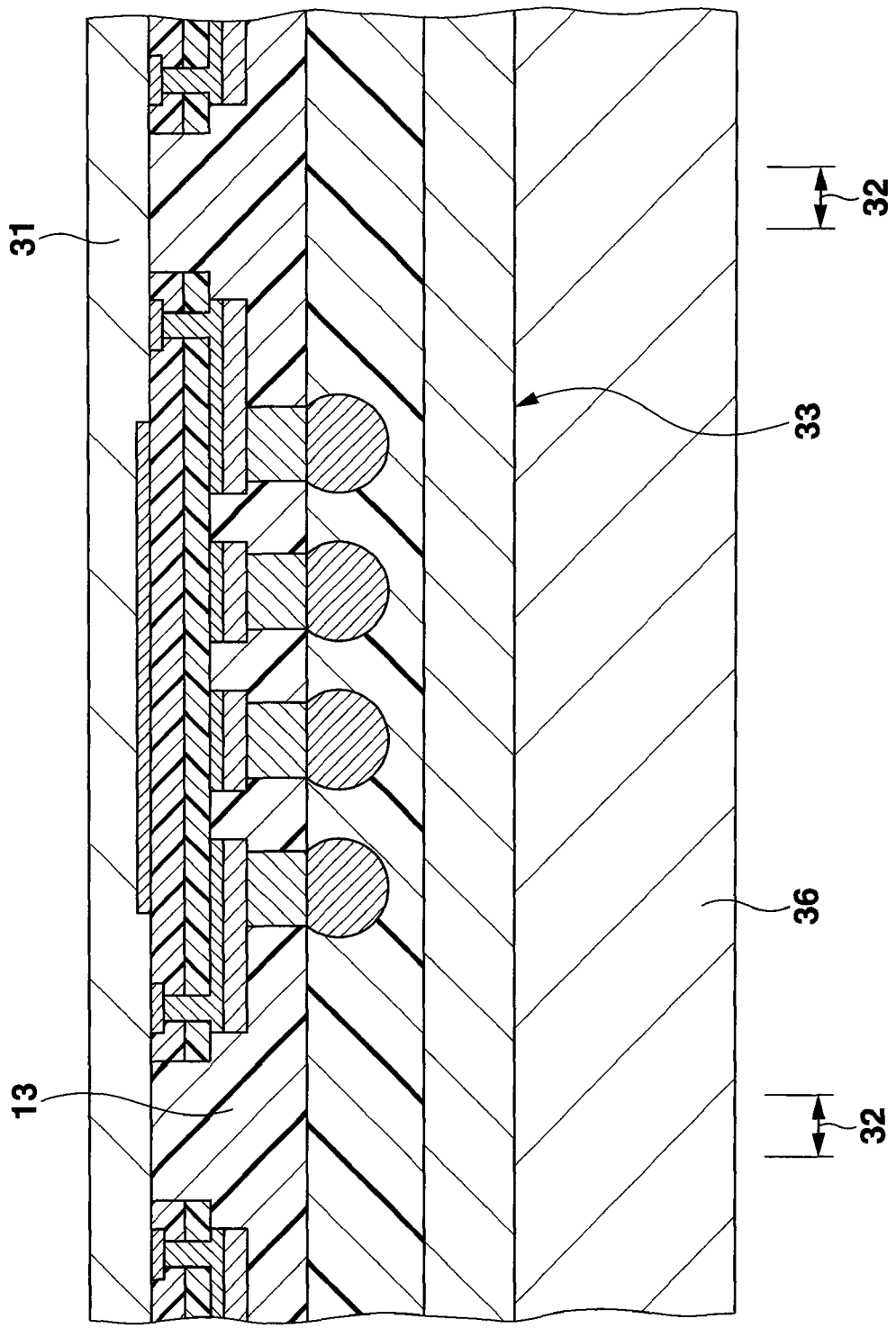
FIG. 5 is a sectional view of a step following FIG. 4.

As shown in FIG. 5, a chuck 36 is then prepared. The chuck 36 is connected to a vacuum source such as an unshown vacuum pump, and sucks and thus sticks and holds a component placed on the chuck 36. The lower surface of the protective tape 33 is then placed on and thus stuck and held by the chuck 36. The lower side of the semiconductor wafer 31 is then properly ground using a grindstone (not shown) to reduce the thickness of the semiconductor wafer 31. In this condition, the sealing film 13 is formed on the lower side of the semiconductor wafer 31, and the protective tape 33 is affixed to the lower side of the sealing film 13. Moreover, the lower surface of the protective tape 33 is stuck and held by the chuck 36. This makes it possible to prevent the semiconductor wafer 31 from easily warping even if the thickness of the semiconductor wafer 31 is reduced. In this case, no glass plate for reinforcement is used. Accordingly, a fabrication process can be less restricted.

Figure 6:
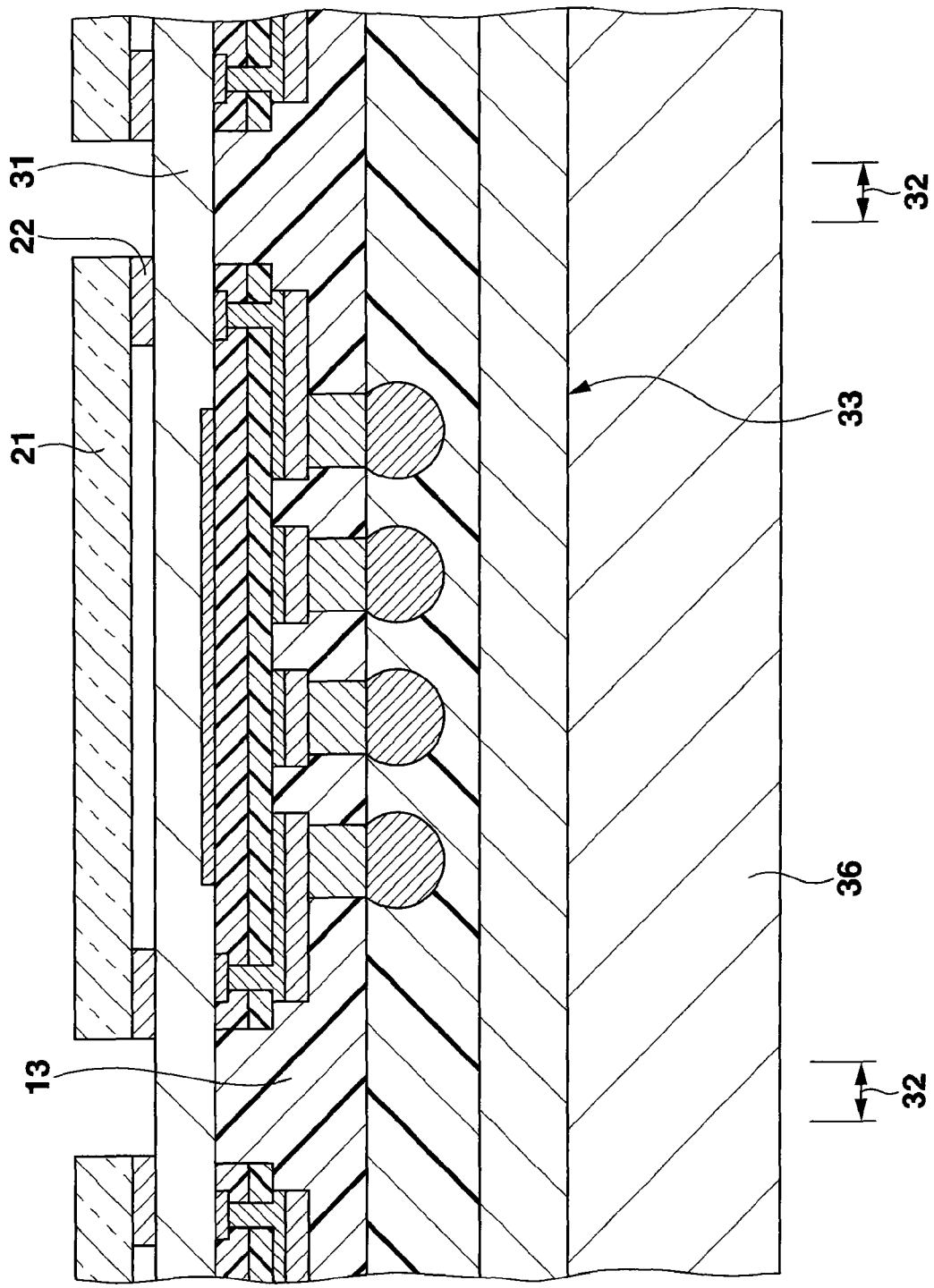
FIG. 6 is a sectional view of a step following FIG. 5.

As shown in FIG. 6, a visible light transmitting plate 21 having a square planar shape is affixed, via a square frame-shaped adhesive layer 22, to the center of a region which has a square planar shape and which is surrounded by the dicing street 32 on the upper surface of the semiconductor wafer 31. Now, when the protective tape 33 is not affixed to the lower side of the sealing film 13 and when a total thickness of the semiconductor wafer 31 and the sealing film 13 is equal to or less than 350 to 300 μm, the warping amount of the semiconductor wafer 31 is great, and the affixing of the visible light transmitting plate 21 is difficult. In contrast, according to this embodiment, the protective tape 33 is affixed to the lower side of the sealing film 13, and the lower surface of the protective tape 33 is stuck and held by the chuck 36. Thus, even when a total thickness of the semiconductor wafer 31 and the sealing film 13 is equal to or less than 350 to 300 μm, the warping amount of the semiconductor wafer 31 is not great, and the affixing of the visible light transmitting plate 21 is not difficult.

Figure 7:
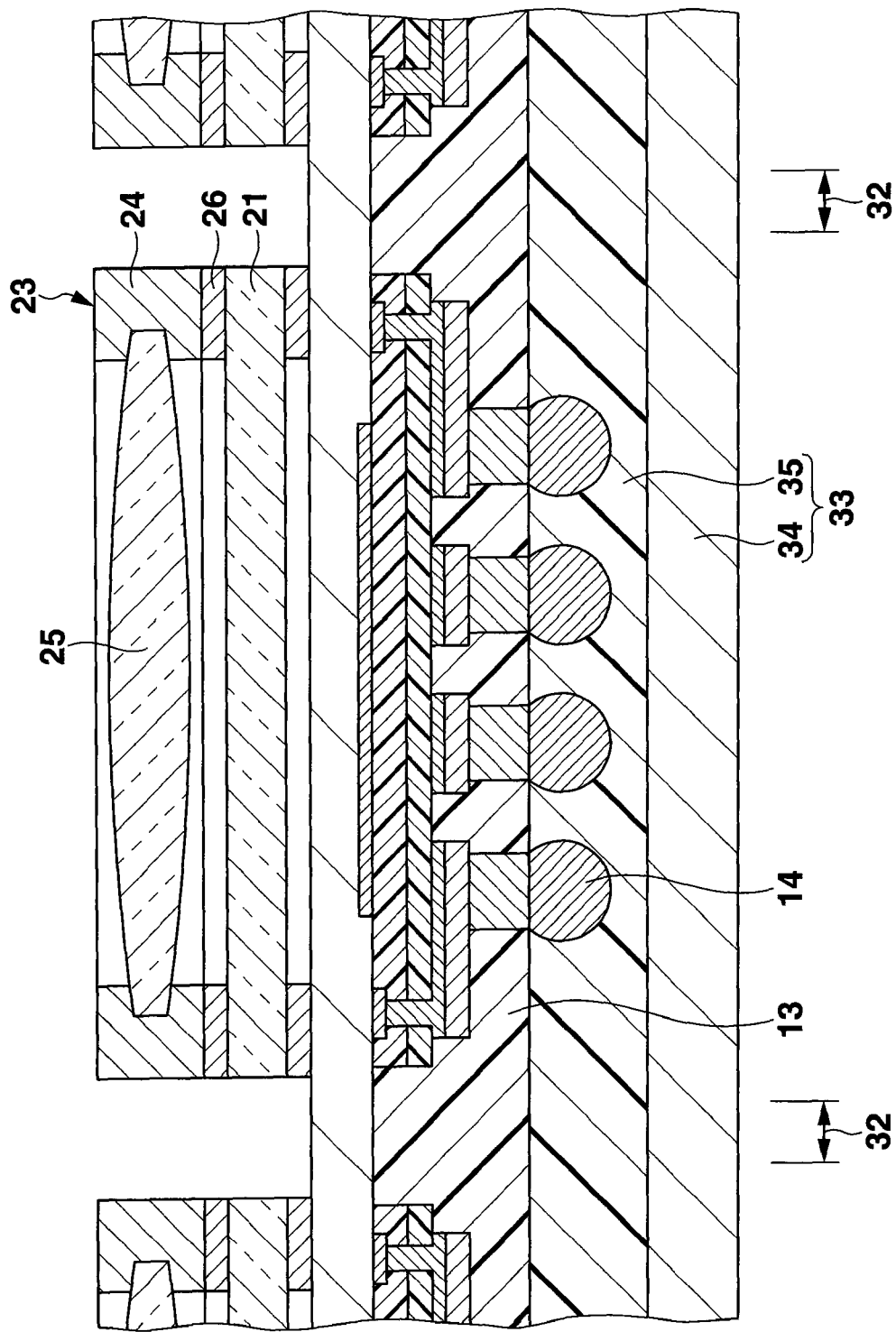
FIG. 7 is a sectional view of a step following FIG. 6.

The lower surface of the protective tape 33 is then unstuck and unheld by the chuck 36, and the protective tape 33 is removed from the chuck 36. Further, as shown in FIG. 7, a lens unit 23 is prepared. The lens unit 23 is provided with a lens 25 within a frame-shaped lens holder 24. The lower surface of the lens holder 24 of the lens unit 23 is then affixed to the peripheral part of the upper surface of the visible light transmitting plate 21 via a frame-shaped adhesive layer 26.

Figure 8:
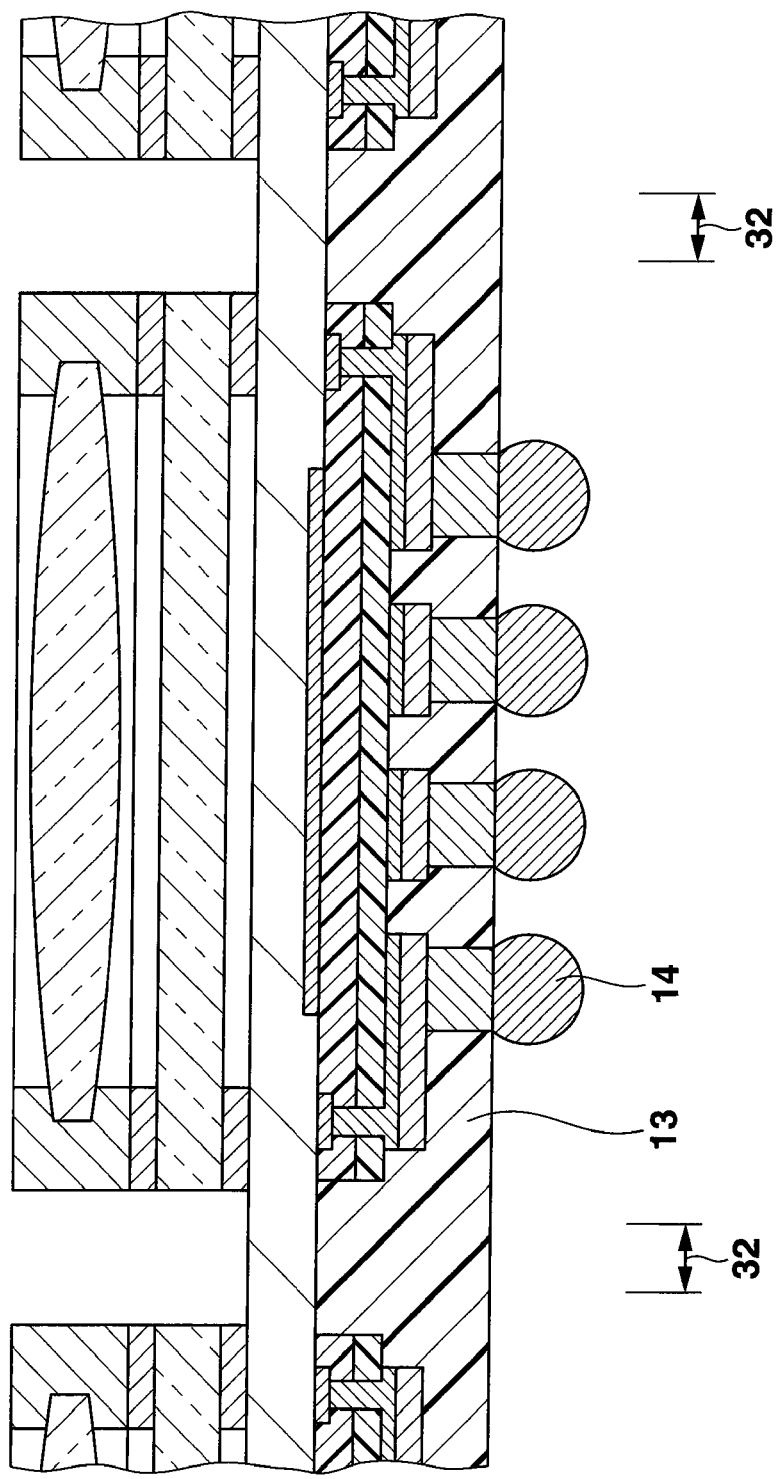
FIG. 8 is a sectional view of a step following FIG. 7.
Figure 9:
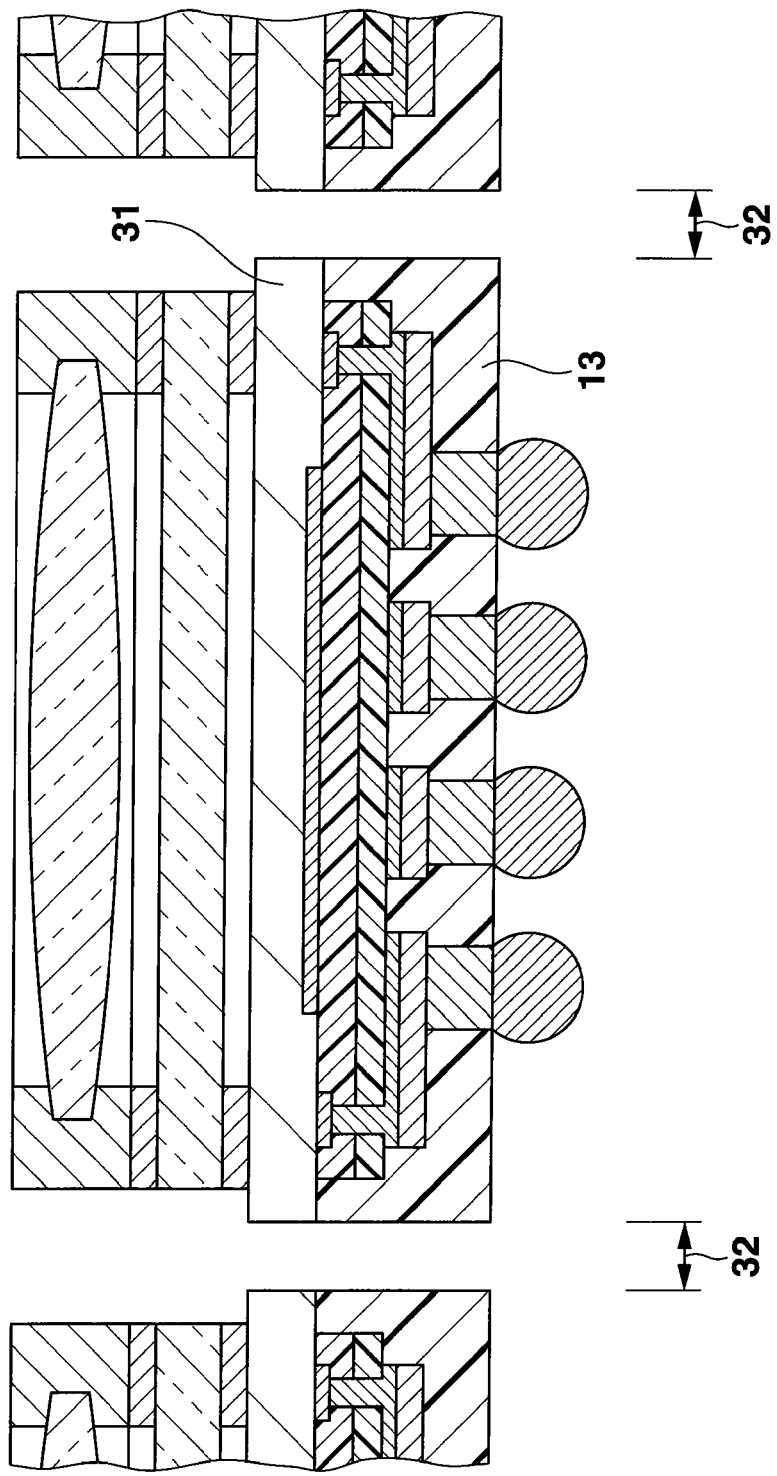
FIG. 9 is a sectional view of a step following FIG. 8.

Ultraviolet rays are then applied from the lower side of the protective tape 33 to cure the uncured sticking agent layer 35 so that the protective tape 33 can be detached. When the protective tape 33 is detached from the lower surface of the sealing film 13 including the solder ball 14, the lower surface of the sealing film 13 including the solder ball 14 is exposed as shown in FIG. 8. As shown in FIG. 9, the semiconductor wafer 31 and the sealing film 13 are then diced along the dicing streets 32, thereby obtaining the imaging apparatuses shown in FIG. 1.

The imaging apparatus thus obtained has a rear irradiation type structure which light enters from the other side of the semiconductor substrate 2 provided with the lens unit 23 as indicated by the arrows showing the direction of the incident light. Therefore, the incident light passes through the lens 25, and passes through the visible light transmitting plate 21 and the semiconductor substrate 2, and then reaches the photoelectric conversion device region 3. In this way, there is no wiring line between the lens and the photosensor, and the lens and the photosensor are therefore structured to be proximate to each other, which allows even oblique light to easily arrive. In this case, as the wiring line 9 and the columnar electrode 12 provided on one surface of the semiconductor substrate 2 are located lower than the photoelectric conversion device region 3, light is not blocked by the wiring line 9 and the columnar electrode 12, and efficiency can be increased. Therefore, there is no problem even if the wiring line 9 and the columnar electrode 12 are formed to overlap the photoelectric conversion device region 3 when viewed in plan. The semiconductor substrate 2 is small in thickness and therefore easily warps. However, in the structure having the columnar electrode 12, the sealing film 13 has a great thickness, so that the warping of the semiconductor substrate 2 can be inhibited.

In the condition shown in FIG. 2, each photosensor formation region may be electrically tested. When there is a photosensor formation region judged to be defective, the visible light transmitting plate 21 and the lens unit 23 may not be installed in the photosensor formation region judged to be defective in the steps shown in FIG. 6 and FIG. 7. This allows for an improvement in yield.

Figure 10:
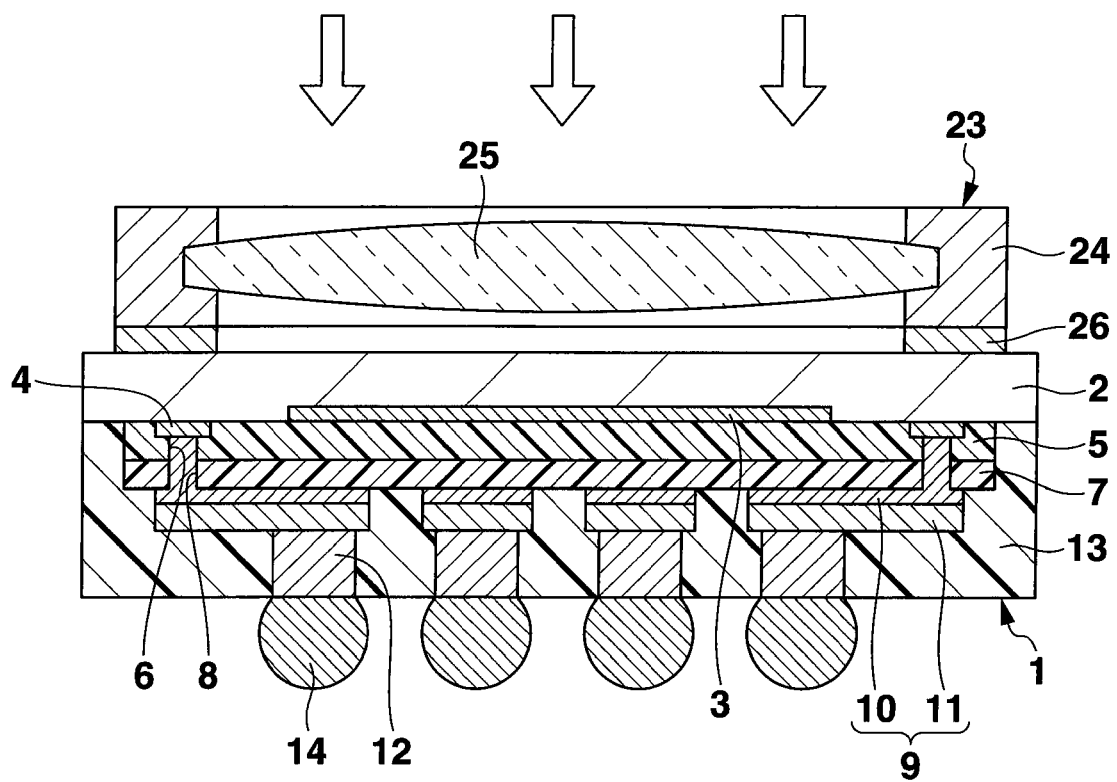
FIG. 10 is a sectional view of an imaging apparatus according to another example of the first embodiment of the present invention.

Although the visible light transmitting plate 21 is affixed to and the lens unit 23 is attached to the other surface of the semiconductor wafer 31 according to the present embodiment, the visible light transmitting plate 21 and the lens unit 23 that are divided into parts may be attached to and formed on the semiconductor substrate 2 after diced. Moreover, although the visible light transmitting plate 21 is provided between the semiconductor substrate 2 of the photosensor 1 and the lens unit 23 according to the present embodiment, for example, a lens 25 equipped with an infrared cut filter that only transmits 10% of infrared rays or less can be used to create a thin structure which is not provided with the visible light transmitting plate 21 as shown in FIG. 10.

Second Embodiment

Figure 11:
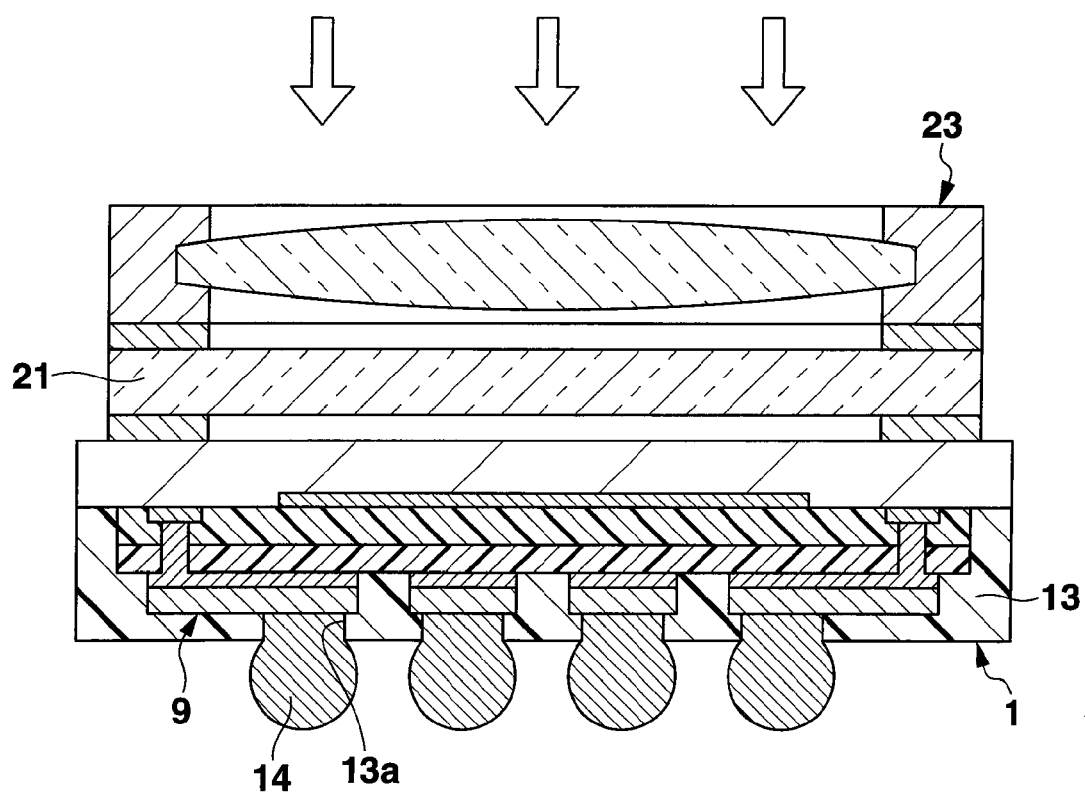
FIG. 11 is a sectional view of an imaging apparatus according to a second embodiment of the present invention.

FIG. 11 shows a sectional view of an imaging apparatus according to a second embodiment of this invention. This imaging apparatus also has a rear irradiation type structure which light enters from the direction indicated by arrows. This imaging apparatus is different from the imaging apparatus shown in FIG. 1 in that a photosensor 1 does not have a columnar electrode 12. In this case, an opening 13a for connecting a solder ball 14 to a land (external connection electrode) of a wiring line 9 is formed in a part of a sealing film 13 corresponding to the land of the wiring line 9.

Figure 12:
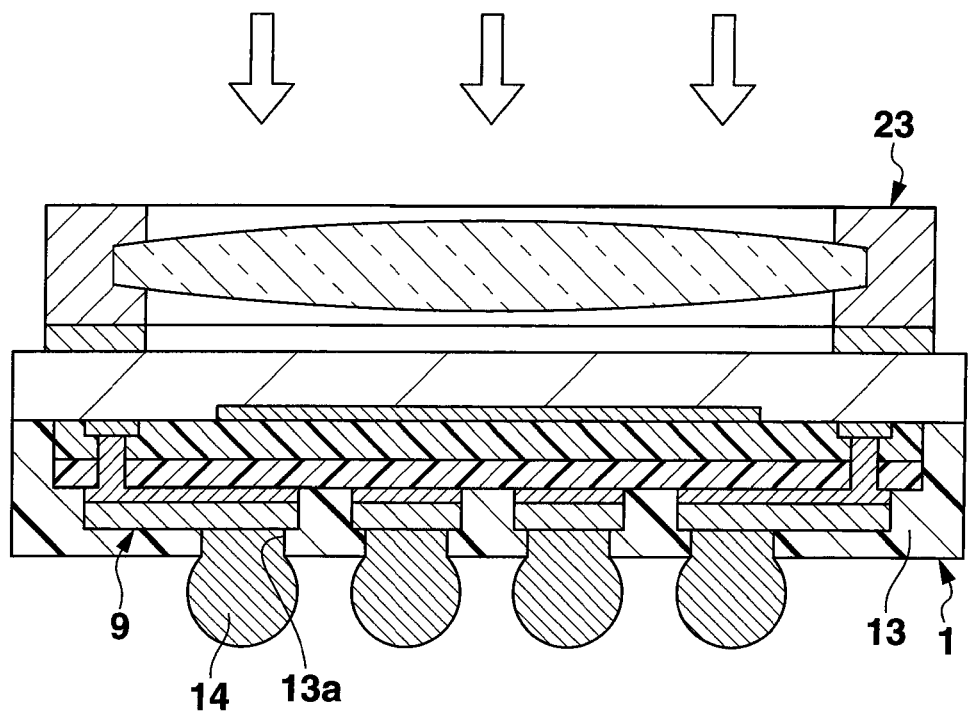
FIG. 12 is a sectional view of an imaging apparatus according to another example of the second embodiment of the present invention.

The sealing film 13 may be made of a polyimide resin or a solder resist. As in the first embodiment, a visible light transmitting plate 21 is provided between a semiconductor substrate 2 of the photosensor 1 and a lens unit 23 in the present embodiment. However, for example, a lens 25 equipped with an infrared cut filter that only transmits 10% of infrared rays or less can be used to create a thin structure which is not provided with the visible light transmitting plate 21 as shown in FIG. 12.

While the embodiments of this invention have been described above, this invention is not limited thereto, and includes the scope of the invention defined by the claims and their equivalents. The invention defined by the initial claims of the present application is additionally noted below.

(Additional Note)

According to a first aspect of the present invention an imaging apparatus comprises a lens unit which light enters from one surface thereof, and a photosensor provided on the other surface of the lens unit, the photosensor comprising a semiconductor substrate which the light exiting from the lens unit enters from one surface thereof, and a photoelectric conversion device and a connection pad which are provided on the other surface of the semiconductor substrate.

The imaging apparatus according to the first aspect of the present invention may further comprise a visible light transmitting material having a visible light transmission factor of 90% or more and having an infrared transmission factor of 10% or less between the semiconductor substrate and the lens unit.

In the imaging apparatus according to the first aspect of the present invention, the visible light transmitting material may include one of materials selected from the group consisting of glass, a methacrylic resin, a fluorene resin, a cycloolefin polymer, an epoxy resin, polyethylene, polystyrene, an AS resin, polyethylene terephthalate, a vinylidene chloride resin, polycarbonate, and a light-blocking ceramic.

In the imaging apparatus according the first aspect of the present invention, the photosensor may comprise an insulating film provided on the other surface of the semiconductor substrate, a wiring line provided on the lower surface of the insulating film to be connected to the connection pad, a columnar electrode provided under a land of the wiring line, and a sealing film provided around the columnar electrode under the wiring line and under the insulating film.

In the imaging apparatus according to the first aspect of the present invention, a solder ball may be provided under the columnar electrode of the photosensor.

In the imaging apparatus according to the first aspect of the present invention, the photosensor may comprise an insulating film provided on the other surface of the semiconductor substrate, a wiring line which is provided on the lower surface of the insulating film to be connected to the connection pad and which includes a land as an external connection electrode, and a sealing film provided in a region under the insulating film including the wiring line except for the land of the wiring line.

In the imaging apparatus according to the first aspect of the present invention, a solder ball may be provided under the land of the wiring line of the photosensor.

In the imaging apparatus according to the first aspect of the present invention, a lens constituting the lens unit may be equipped with an infrared cut filter that only transmits 10% of infrared rays or less.

According to a second aspect of the present invention, an imaging apparatus manufacturing method comprises disposing a lens unit on the other surface of a semiconductor wafer of a photosensor, a photoelectric conversion device region and a connection pad being provided on one surface of the semiconductor wafer.

In the imaging apparatus manufacturing method according to the second aspect of the present invention, a visible light transmitting material having a visible light transmission factor of 90% or more and having an infrared transmission factor of 10% or less may be provided between the semiconductor substrate and the lens unit.

In the imaging apparatus manufacturing method according the second aspect of the present invention, the visible light transmitting material may include one of materials selected from the group consisting of glass, a methacrylic resin, a fluorene resin, a cycloolefin polymer, an epoxy resin, polyethylene, polystyrene, an AS resin, polyethylene terephthalate, a vinylidene chloride resin, polycarbonate, and a light-blocking ceramic.

In the imaging apparatus manufacturing method according to the second aspect of the present invention, an external connection electrode connected to the connection pad may be formed, and the semiconductor wafer may be diced to obtain imaging apparatuses.

The imaging apparatus manufacturing method according to the second aspect of the present invention may further comprise forming a solder ball under the external connection electrode before disposing the visible light transmitting material.

The imaging apparatus manufacturing method according to the second aspect of the present invention may further comprise grinding the upper side of the semiconductor wafer after forming the solder ball.

The imaging apparatus manufacturing method according to the second aspect of the present invention may further comprise affixing a protective tape to the side of the solder ball of the semiconductor wafer before grinding the upper side of the semiconductor wafer after forming the solder ball, and detaching the protective tape after disposing the lens unit.

In the imaging apparatus manufacturing method according to the second aspect of the present invention, a wiring line may be provided on the lower surface of the insulating film to be connected to the connection pad, a columnar electrode as the external connection electrode may be provided under a land of the wiring line, and a sealing film may be provided around the columnar electrode under the insulating film including the wiring line.

In the imaging apparatus manufacturing method according to the second aspect of the present invention, a wiring line may be provided on the lower surface of the insulating film to be connected to the connection pad and includes a land as the external connection electrode, and a sealing film is provided in a region under the insulating film including the wiring line except for a land of the wiring line.

In the imaging apparatus manufacturing method according to the second aspect of the present invention, a lens constituting the lens unit may be equipped with an infrared cut filter that only transmits 10% of infrared rays or less.

In the imaging apparatus manufacturing method according to the second aspect of the present invention, each photosensor formation region may be electrically tested, and when there is a photosensor formation region judged to be defective, the visible light transmitting material and the lens unit are not disposed in the photosensor formation region judged to be defective.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An imaging apparatus manufacturing method, the method comprising:
   providing a protective tape on a surface of a sealing film formed on a first surface of a semiconductor substrate of a photosensor;
   providing a visible light transmitting plate on a second surface of the semiconductor substrate;
   disposing a lens unit on the visible light transmitting plate; and
   removing the protective tape after the lens unit is disposed;
   wherein the photosensor comprises, on the first surface of the semiconductor substrate:
      a photoelectric conversion device region and a connection pad;
      an insulating film;
      a wiring line provided on a lower surface of the insulating film to be connected to the connection pad;
      a columnar electrode provided under a land of the wiring line; and
      the sealing film, the sealing film being provided around the columnar electrode under the wiring line and under the insulating film; and
   wherein a total thickness of the semiconductor substrate and the sealing film is 350 μm or less.

2. The imaging apparatus manufacturing method according to claim 1, wherein a visible light transmitting material having a visible light transmission factor of 90% or more and having an infrared transmission factor of 10% or less is provided between the semiconductor substrate and the lens unit.

3. The imaging apparatus manufacturing method according to claim 2, wherein the visible light transmitting material includes one of materials selected from the group consisting of glass, a methacrylic resin, a fluorene resin, a cycloolefin polymer, an epoxy resin, polyethylene, polystyrene, an AS resin, polyethylene terephthalate, a vinylidene chloride resin, polycarbonate, and a light-blocking ceramic.

4. The imaging apparatus manufacturing method according to claim 2, further comprising forming a solder ball under the columnar electrode before disposing the visible light transmitting material.

5. The imaging apparatus manufacturing method according to claim 4, further comprising grinding an upper side of the semiconductor substrate after forming the solder ball.

6. The imaging apparatus manufacturing method according to claim 5, further comprising affixing the protective tape to a side of the solder ball of the semiconductor substrate before grinding the upper side of the semiconductor substrate after forming the solder ball.

7. The imaging apparatus manufacturing method according to claim 2, wherein each photosensor formation region is electrically tested, and when there is a photosensor formation region judged to be defective, the visible light transmitting material and the lens unit are not disposed in the photosensor formation region judged to be defective.

8. The imaging apparatus manufacturing method according to claim 1, wherein a lens of the lens unit is equipped with an infrared cut filter that only transmits 10% of infrared rays or less.

9. An imaging apparatus manufacturing method, the method comprising:
   providing a protective tape on a surface of a sealing film formed on a first surface of a semiconductor substrate of a photosensor;
   providing a visible light transmitting plate on a second surface of the semiconductor substrate;
   disposing a lens unit on the visible light transmitting plate; and
   removing the protective tape after the lens unit is disposed;
   wherein the photosensor comprises, on the first surface of the semiconductor substrate:
      a photoelectric conversion device region and a connection pad;
      an insulating film;
      a wiring line which is provided on a lower surface of the insulating film to be connected to the connection pad and which includes a land as an external connection electrode; and
      the sealing film, the sealing film being provided in a region under the insulating film including the wiring line except for a land of the wiring line; and
   wherein a total thickness of the semiconductor substrate and the sealing film is 350 μm or less.

* * * * *